United States Patent
Bako et al.

(10) Patent No.: US 11,063,567 B2
(45) Date of Patent: Jul. 13, 2021

(54) INPUT CIRCUIT WITH WIDE RANGE INPUT VOLTAGE COMPATIBILITY

(71) Applicant: TEXAS INSTRUMENTS INCORPORATED, Dallas, TX (US)

(72) Inventors: Niko Bako, Freising (DE); Christian Gehle, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/582,733

(22) Filed: Sep. 25, 2019

(65) Prior Publication Data
US 2021/0091738 A1    Mar. 25, 2021

(51) Int. Cl.
| H03B 1/00 | (2006.01) |
| H03K 3/00 | (2006.01) |
| H03G 3/30 | (2006.01) |
| H03F 3/68 | (2006.01) |
| H03F 3/45 | (2006.01) |

(52) U.S. Cl.
CPC .......... *H03G 3/30* (2013.01); *H03F 3/45475* (2013.01); *H03F 3/68* (2013.01)

(58) Field of Classification Search
CPC ....... H03K 19/00361; H03K 19/00315; H03K 19/00384; H04L 25/028; H04L 25/0272
USPC ......................................... 327/108, 560–563
See application file for complete search history.

(56) References Cited

U.S. PATENT DOCUMENTS

| 5,557,238 A * | 9/1996 | Weiss ........................ H03F 3/26 330/258 |
| 7,202,746 B1 * | 4/2007 | Kejariwal ................. H03F 1/08 330/294 |
| 7,436,216 B1 * | 10/2008 | Brunn ................. H03F 3/45183 326/83 |
| 7,961,011 B2 * | 6/2011 | Iwamatsu ............ H03G 3/3005 327/65 |
| 9,577,593 B2 * | 2/2017 | Chiu ....................... H03F 1/086 |
| 2002/0149427 A1 * | 10/2002 | Schrodinger ....... H03F 3/45237 330/253 |
| 2003/0102913 A1 * | 6/2003 | Nelson ................... H03H 11/24 330/144 |
| 2008/0116975 A1 * | 5/2008 | Malone ................. H03F 1/3211 330/254 |
| 2011/0234312 A1 * | 9/2011 | Lachhwani ......... H03F 3/45475 330/104 |
| 2012/0269296 A1 * | 10/2012 | Chuang ............... H03F 3/45179 375/316 |
| 2016/0115016 A1 * | 4/2016 | Liu ......................... B81B 3/001 438/50 |
| 2017/0040952 A1 * | 2/2017 | Dong .................... H03F 1/3211 |

\* cited by examiner

*Primary Examiner* — Quan Tra
(74) *Attorney, Agent, or Firm* — John R. Pessetto; Charles A. Brill; Frank D. Cimino

(57) ABSTRACT

An input circuit includes an input stage having an input node and a direct-current (DC) amplifier coupled to the input node. The input circuit also includes an alternating-current (AC) amplifier coupled to an output node of the DC amplifier. The input circuit also includes a capacitor coupled between the input node and the output node of the DC amplifier. The input circuit also includes a voltage divider coupled to the DC amplifier and the AC amplifier. The voltage divider includes first resistor associated with the DC amplifier and a second resistor associated with the AC amplifier, where the first resistor is larger than the second resistor.

15 Claims, 5 Drawing Sheets

INPUT CIRCUIT WITH WIDE RANGE INPUT VOLTAGE COMPATIBILITY

BACKGROUND

In electronic systems, different components (circuitries) have different voltage or current requirements. To account for such differences, an input stage can be used to condition a signal for input to a succeeding stage or component. For example, buffer circuits are used between mismatched components. A buffer is a unity gain or higher amplifier configured to provide sufficient drive capability to pass signals or data bits along to a succeeding stage or component. Voltage buffers increase available current for low impedance inputs while retaining the voltage level. Current buffers keep the current the same while driving high impedance inputs at higher voltage levels.

The performance targets for clock buffer input stages are becoming more and more demanding in terms of low propagation delay (tdp), supported frequency range, input clock signaling standards (e.g., LVPECL, LVDS, HSDS, CML, etc.), and phase noise performance. Migration to faster technologies (e.g., lower technology nodes) helps to improve propagation delay, phase noise and operating frequencies. On the other hand, supply voltage scaling often imposes restrictions on the supported input clock standards. As an example, in the case of the LVPECL standard, voltage levels are defined with respect to the input supply voltage (e.g., a high voltage level of VDD-0.8V and a low level of VDD-1.8V). If the minimum VDD for the LVPECL standard is 2.5V and the VDD for 130 nm or lower technologies used for clock buffer input stage components is 1.2V or less, then the LVPECL voltage levels could destroy components in a clock buffer input stage. Efforts to improve buffers are ongoing.

SUMMARY

In accordance with at least some examples of the disclosure, an input circuit comprises an input stage having a first input node and a direct-current (DC) amplifier coupled to the first input node. The input circuit also comprises an alternating-current (AC) amplifier having a second input node coupled to a first output node of the DC amplifier. The input circuit also comprises a capacitor coupled between the first input node and the first output node. The input circuit also comprises a voltage divider between the first output node and the second input node. The voltage divider comprises first resistor associated with the DC amplifier and a second resistor associated with the AC amplifier, where the first resistor is larger than the second resistor.

In accordance with at least some examples of the disclosure, an input circuit comprises a clock buffer circuit. The clock buffer circuit comprises a complementary metal-oxide-semiconductor (CMOS) input stage having a first input node and a DC amplifier coupled to the first input node. The CMOS input stage also comprises an AC amplifier having a second input node coupled to a first output node of the DC amplifier. The CMOS input stage also comprises a capacitor coupled between the first input node and the first output node, where the CMOS input stage is configured to receive a clock voltage at the first input node. The clock voltage is higher than an input voltage supply for the DC amplifier and the AC amplifier.

In accordance with at least some examples of the disclosure, a method for signal input comprises receiving a differential input signal having a DC signal component and an AC signal component. The method also comprises performing a first amplification associated with the DC signal component of the differential input signal. The method also comprises performing a second amplification associated with the AC signal component of the differential input signal, wherein the second amplification is greater than the first amplification.

BRIEF DESCRIPTION OF THE DRAWINGS

For a detailed description of various examples, reference will now be made to the accompanying drawings in which.

DETAILED DESCRIPTION

Disclosed herein are input circuit topologies referred to as buffer circuit topologies with an input stage having a direct-current (DC) amplifier, an alternative-current (AC) amplifier, and a voltage divider. The voltage divider includes a first resistor associated with the DC amplifier and a second resistor associated with the AC amplifier, where the first resistor is larger than the second resistor. With the voltage divider, the input common mode voltage can be larger than the input supply voltage for buffer circuit components (circuitries) (e.g., inverter components) without damaging these buffer circuit components. In some examples, the DC amplifier receives the input common mode voltage, while the AC amplifier receives a reduced input common mode voltage via the DC amplifier. Another description that applies to the buffer circuit topologies described herein is that the DC amplifier is "weak" such that the DC amplifier does not overwrite the AC components of the input signal.

In some examples, the DC amplifier includes a preamplifier circuit with a frequency-compensated voltage divider configured to scale the input common mode voltage. With the buffer circuit topologies described herein, several design objectives are considered. One objective is compatibility with different input common mode voltages. Another objective is that the input common mode voltage can be higher than the input supply voltage for the buffer circuit. Another objective is compatibility with different differential inputs with swing voltages. Another objective is the use of a frequency-compensated voltage divider to enable a wide input frequency range for the DC amplifier (e.g., up to 10 GHz). Another objective is to support frequencies from DC (single pulse) to GHz range. Another objective is to join the DC amplifier and the AC amplifier in a way that does not degrade performance of the AC amplifier and vice versa. Another objective is to avoid an external decoupling capacitor. Another objective is to avoid degrading the input signal duty cycle of the differential input signal. Another objective is compatibility with single-ended inputs. Another objective is to use complementary metal-oxide-semiconductor (CMOS) components, which are smaller, cheaper, and easier to migrate to other technology nodes compared to bipolar transistor components. Other objectives include fast response (low propagation delay), low jitter (phase noise), low power, and small circuit footprint. To provide a better understanding, various buffer circuit options and related scenarios are described using the figures as follows.

Figure 1:
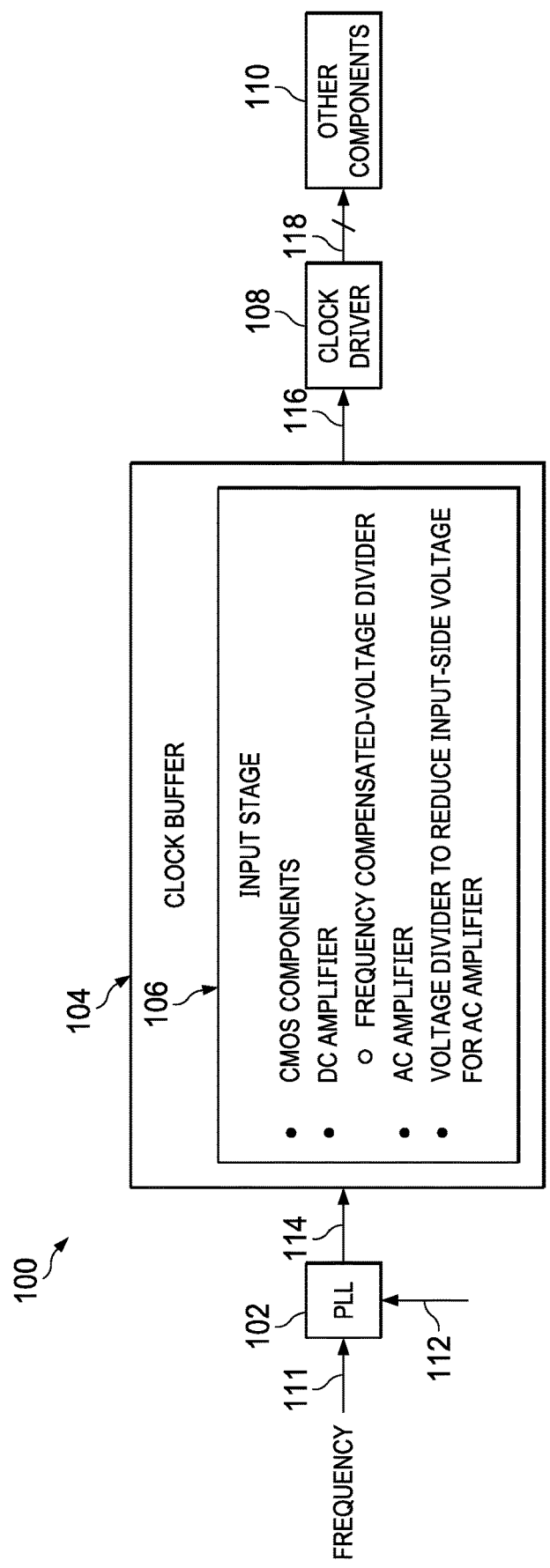
FIG. 1 is a block diagram showing a system in accordance with some examples.

FIG. 1 is a block diagram showing a system 100 in accordance with some examples. In FIG. 1, the system 100 represents a consumer product, an integrated circuit or chip, a printed circuit board (PCB) with integrated circuit and/or discrete components, and/or another electrical device. As shown, the system 100 includes a phase-locked loop (PLL) 102 configured to receive a frequency input signal 111 and a feedback signal 112. The output of the PLL 102 is a signal 114 with a frequency based on the difference between the VIN signal 111 and the feedback signal 112. In the example of FIG. 1, the signal 114 is provided to a clock buffer circuit 104, which provides the signal 116 (a buffered version of the signal 114) to a clock driver 108. In some examples, the clock buffer circuit 104 is a stand-alone integrated circuit (IC) or chip. In other examples, the clock buffer circuit 104 is a combined with other components (e.g., the PLL 102, the clock driver 108, and/or one or more other components 110) stand-alone integrated circuit (IC) or chip. The clock driver 108 is configured to provide a plurality of clock signals 118 for other components 110. Without limitation, the other components 110 may correspond to a receiver component, a demodulation component, a processor, or other components.

As shown, the clock buffer circuit 104 includes an input stage 106 with various features. More specifically, in some examples, the input stage 106 includes features such as CMOS components and a DC amplifier. The input stage 106 also includes features such as an AC amplifier and a voltage divider, where the voltage divider reduces the input-side voltage for the AC amplifier. With the clock buffer circuit 104, several design objectives are considered. One objective is compatibility with different input common mode voltages. Another objective is that the input common mode voltage can be higher than the input supply voltage for the clock buffer circuit 104. Another objective is compatibility with different differential inputs with swing voltages. Another objective is the use of a frequency-compensated voltage divider to enable a wide input frequency range for the DC amplifier (e.g., up to 10 GHz). Another objective is to support frequencies from DC (single pulse) to GHz range. Another objective is to join the DC amplifier and the AC amplifier in a way that does not degrade performance of the AC amplifier and vice versa. Another objective is to avoid an external decoupling capacitor. Another objective is to avoid degrading the input signal duty cycle of the differential input signal. Another objective is compatibility with single-ended inputs. Another objective is to use CMOS components. Other objectives include fast response (low propagation delay), low jitter (phase noise), low power, and small circuit footprint.

Figure 2:
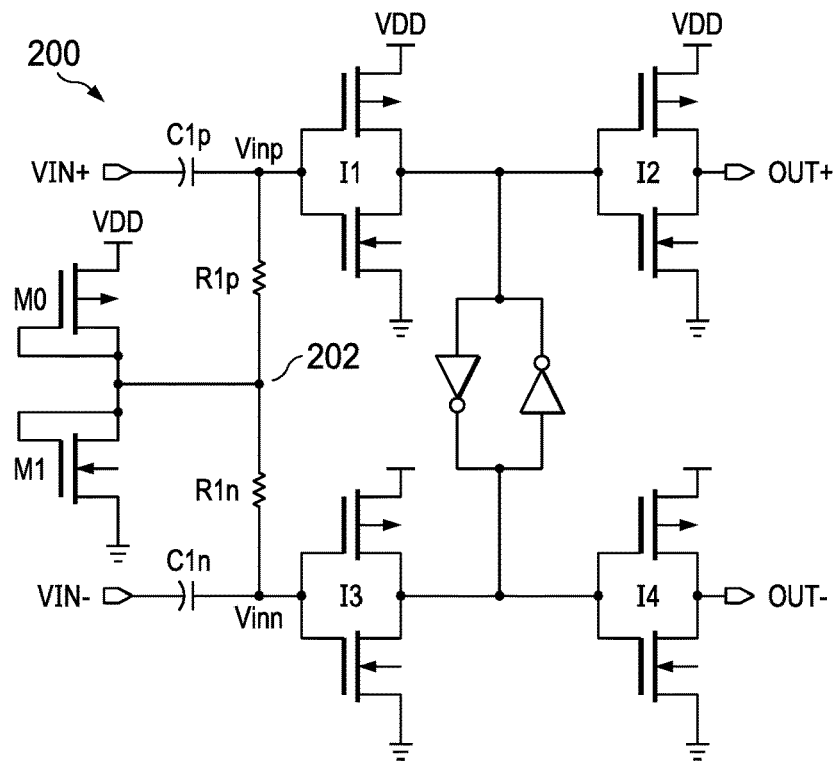
FIG. 2 is a schematic diagram showing an alternating-current (AC) amplifier circuit in accordance with some examples.

FIG. 2 is a schematic diagram showing an AC amplifier circuit 200 in accordance with some examples. As shown, the AC amplifier circuit 200 includes a first differential input (VIN+) node and a second or complementary differential input (VIN−) node. The VIN+ node is coupled to a first plate of a capacitor (C1p), where the second plate of C1p is coupled to the first end of a resistor (R1p). Meanwhile, VIN− node is coupled to a first plate of a complementary capacitor (C1n), where the second plate of C1n is coupled to the first end of a complementary resistor (R1n). As shown, the second ends of R1p and R1n are coupled to each other at node 202. Also, the node 202 is coupled between two transistors, M0 and M1, where the first current terminal of M0 is coupled to an input supply voltage (VDD) node. The control terminal and the second current terminal of M0 are coupled to the node 202. As shown, the control terminal and the first current terminal of M1 are coupled to the node 202. Also, the second current terminal of M1 is coupled to a ground node.

In the example of FIG. 2, the second plate of C1p and the first end of R1p are coupled to an internal node (vinp). In operation, the signal at vinp is provided to a first differential output (OUT+) node via a first inverter (I1) and a second inverter (I2). Also, the second plate of C1n and the first end of R1n are coupled to another internal node (vinn). In operation, the signal at the vinn node is provided to a second or complementary differential output (OUT−) node via a third inverter (I3) and a fourth inverter (I4).

Figure 3:
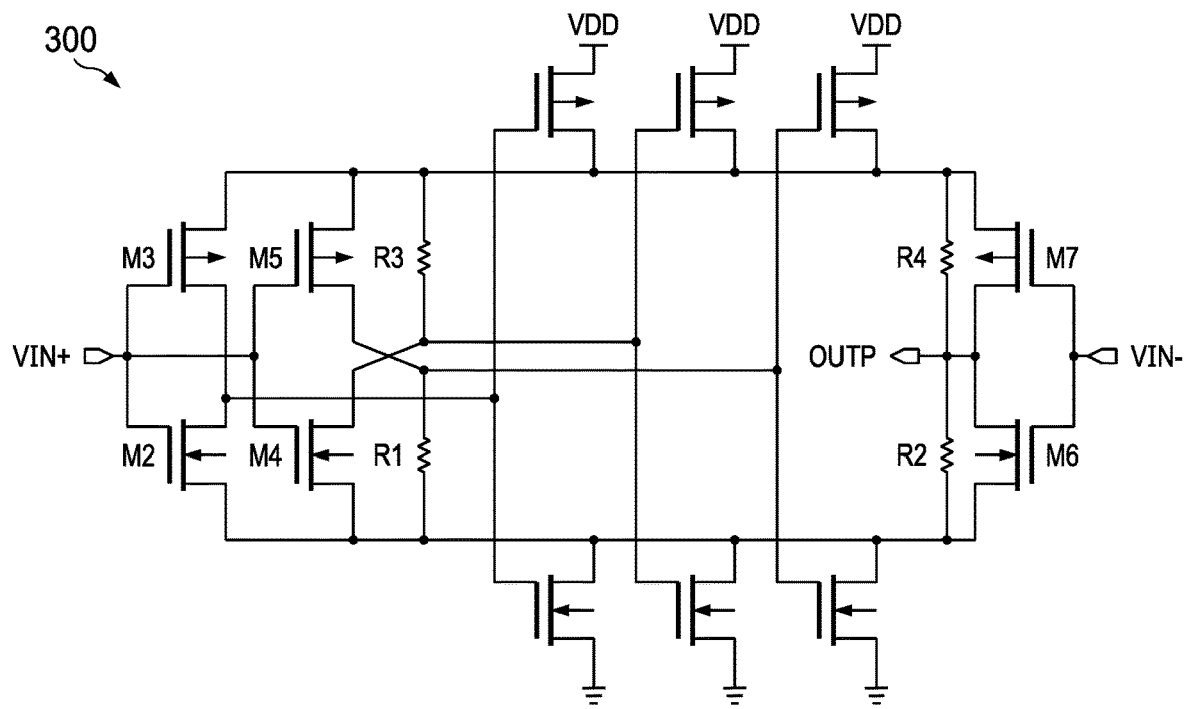
FIG. 3 is a schematic diagram showing a direct-current (DC) preamplifier circuit in accordance with some examples.

In some examples, the inverters (e.g., I1-I4) of the AC amplifier circuit 200 are biased for maximum gain, where the DC point is set by M0 and M1 (e.g., diode connected transistors). The AC amplifier 200 can support any input common mode voltage standard because C1p and C1n remove the input signal DC voltage. In operation, on every rising and falling edge, the voltage difference (Δv) related to nodes vinp and vinn will change polarity (e.g., on the rising edge Δv>0V; on the falling edge Δv<0V), triggering the inverters I1-I4 such that the amplified input signal will quickly propagate to the OUT+ and OUT− nodes. Frequencies which are lower than the bandwidth of the filter (related to R1p, R1, C1p, C1n) might cause improper operation of the AC amplifier circuit 200. If the time constant of the filter is much smaller than input signal period, the voltages at the nodes vinp and vinn will become equal and the AC amplifier circuit 200 will start failing. Any small disturbance or noise at vinp and vinn might cause switching of the inverters I1-I4 even if there is no switching of the input signal. According to aspects of the disclosure, use of a DC amplifier prevents the voltage at vinp and vinn from becoming equal. FIG. 3 is a schematic diagram showing a DC preamplifier circuit 300 in accordance with some examples. The DC preamplifier circuit 300 (e.g., with some modification) can be added to the AC amplifier circuit 200 to prevent the voltages at vinp and vinn from becoming equal.

Figure 4:
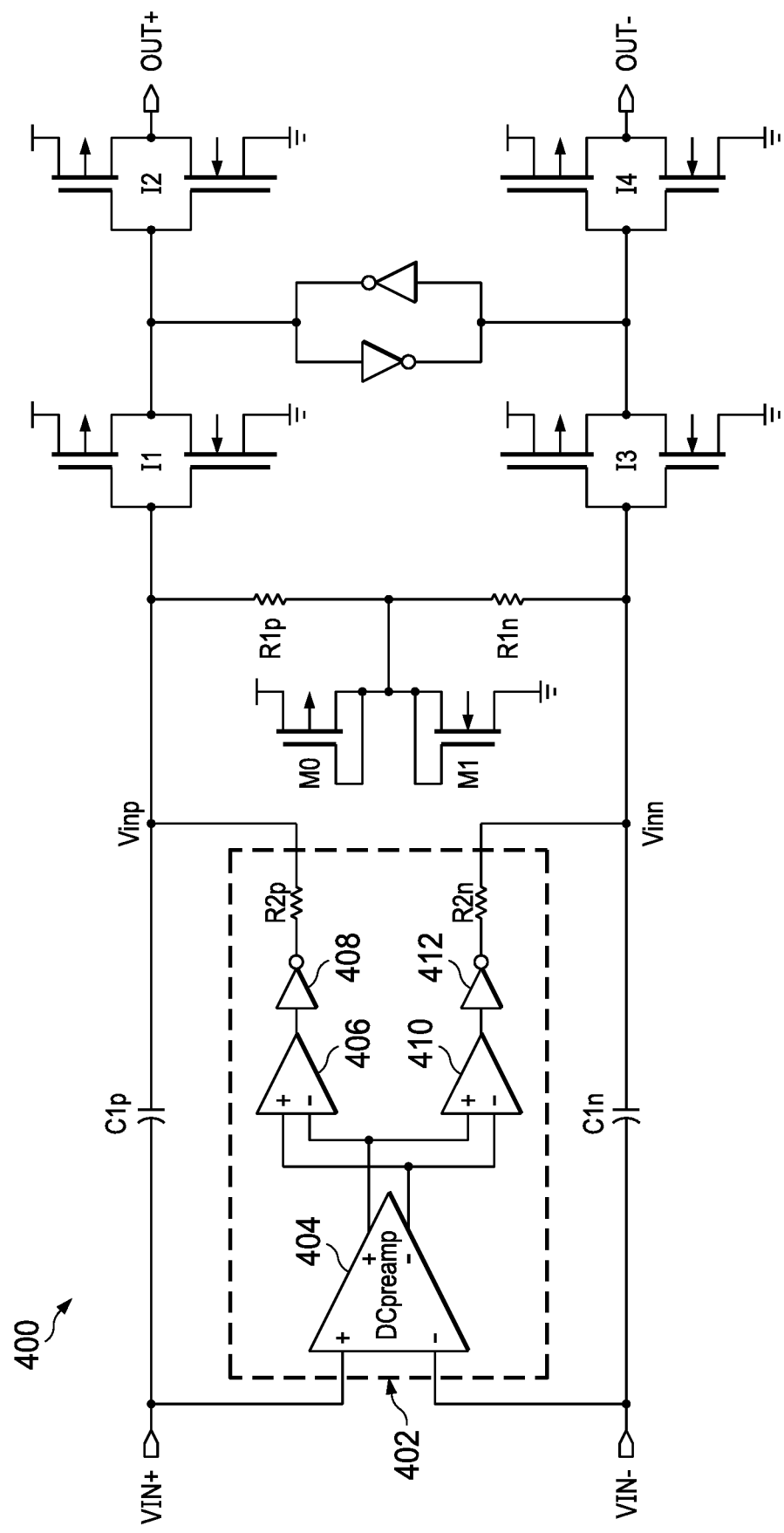
FIG. 4 is a schematic diagram showing a buffer circuit in accordance with some examples.

FIG. 4 is a schematic diagram showing a buffer circuit 400 in accordance with some examples. As shown, the buffer circuit 400 includes the components of the AC amplifier circuit 200 introduced in FIG. 2. More specifically, FIG. 4 shows the VIN+ node, the VIN− node, C1p, C1n, vinp, vinn, M0, M1, R1p, R1n, I1-I4, the OUT+ node, and the OUT− node previously described for the AC amplifier circuit 200 of FIG. 2. In addition, the buffer circuit 400 includes a DC amplifier circuit 402 coupled to the VIN+ and VIN− nodes and to the vinp and vinn nodes.

In the example of FIG. 4, the DC amplifier circuit 402 includes a DC preamplifier stage 404 with input nodes couples to the VIN+ and VIN− nodes. The output nodes of the DC preamplifier stage 404 are coupled to gain stages 406 and 410. The output of the gain stage 406 is coupled to an input node of an inverter 408. Also, the output node of the inverter 408 is coupled to a first end of a resistor (R2p), where the second end of R2p is coupled to vinp. Meanwhile, the output of the gain stage 410 is coupled to an input node of an inverter 412. The output node of the inverter 412 is coupled to a first end of a resistor (R2n), where the second end of R2n is coupled to vinn.

In operation, the inverters 408 and 412 are used as the drivers which drive the resistors R2p and R2n. The use of the R2p and R2n results in a voltage divider based on R1p, R1n, R2p, R2n, that makes the DC amplifier circuit 402 weak compared to the AC amplifier. More specifically, the output signal from the inverters 408 and 412 is divided using R1p, R1n, R2p, and R2n. If the inverters 408 and 412 were directly connected to the vinp and vinn, the DC amplifier circuit 402 would overwrite the AC component of the signal coming from VIN+ and VIN− nodes through the capacitors C1p and C1n. Thus, without R2p and R2n, the AC signal component coming from VIN+ and VIN− nodes would be damped by the inverters 408 and 412. In such case, the inverters 408 and 412 would act as voltage sources with small output impedance (almost ideal voltage sources) and the AC amplifier would be ineffective. Adding R2p and R2n causes the influence of the DC amplifier circuit 402 to become weaker because the vinp and vinn are not strongly driven by ideal voltage sources. In the example buffer circuit 400 of FIG. 4, the overall signal at vinp and vinn is the superposition of the AC component coming through C1p and C1n and the DC component coming through DC amplifier circuit 402. With the DC amplifier circuit 402, the voltages at vinp and vinn will never be equal even at very low frequencies (e.g., $\Delta v \neq 0V$), which is designed to prevent false triggering. At the same time the AC component will trigger the inverters I1-I4 and the amplified signal will propagate very quickly to the OUT+ and OUT− nodes.

In some examples, the ratio of the R2 resistors (R2p, R2n) to R1 resistors (R1p, R1n) is predetermined to improve performance. As an example, if the R1 resistors are larger than the R2 resistors (e.g., R1=5*R2) then, for the low input voltage swing (e.g., 100 mV and lower), $\Delta v$ will change polarity slowly because the DC voltage component is larger than the AC voltage component at vinp/vinn. In this example, the switching speed will depend mostly on the speed of the DC amplifier circuit 402, which degrades performance. On the other hand, if the R1 resistors are smaller than the R2 resistors (e.g., 5*R1=R2), $\Delta v$ will change polarity more quickly because the DC voltage component is smaller than the AC voltage component at vinp/vinn. Accordingly, in some examples, each R2 resistor is selected to be larger than each R1 resistor. On the other hand, the R2 resistors cannot be too big compared to the R1 resistors because the result would be that $\Delta v$ is close to 0V, which increases circuit sensitivity to interference. In some examples, R2=5*R1 is used in the buffer circuit 400 as a tradeoff between speed and interference sensitivity. In other examples, the ratio of R2 and R1 varies (e.g., R2=1.5*R1, R2=2*R1, R2=3*R1, etc.).

Figure 5:
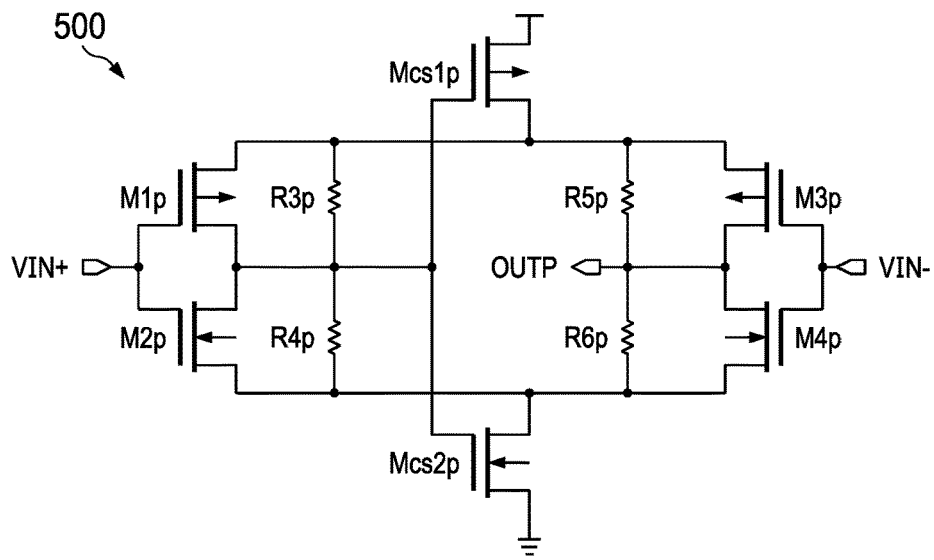
FIG. 5 is a schematic diagram showing an input common mode (ICM) amplifier circuit in accordance with some examples.

FIG. 5 is a schematic diagram showing an input common mode (ICM) amplifier circuit 500 in accordance with some examples. In some examples, the ICM amplifier circuit 500 is part of the DC preamplifier circuit 404 represented in FIG. 4. As shown, the ICM amplifier circuit 500 is formed by transistors M1p-M4p, resistors R3p-R6p. In the example of FIG. 5, the other transistors, Mcs1 and MCs2, are current source transistors that are used for amplification.

Figure 6:
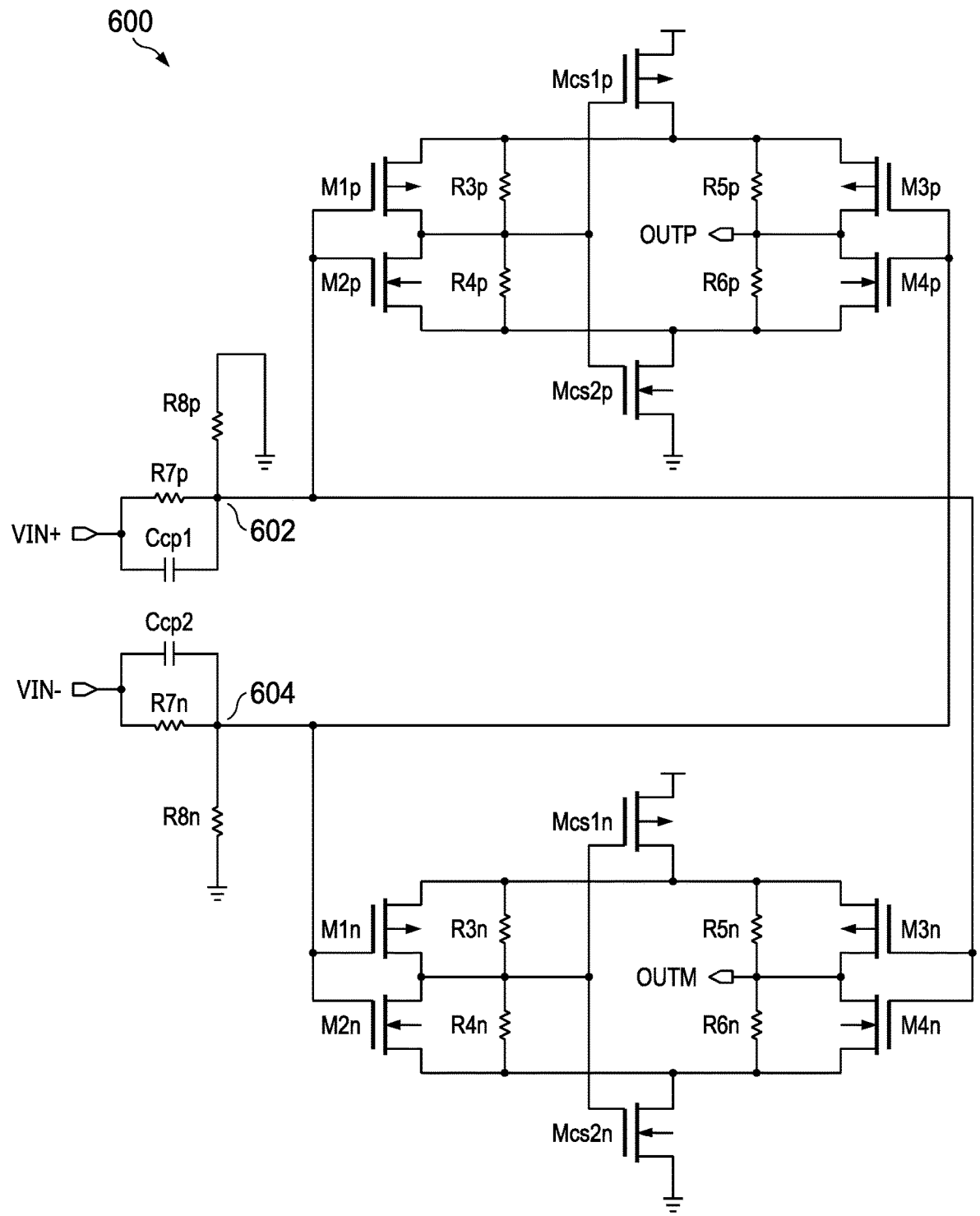
FIG. 6 is a schematic diagram showing an ICM amplifier circuit for differential signals in accordance with some examples.

In scenarios where the input signal is a differential signal, two ICM amplifier circuits may be used in the DC preamplifier circuit 404. FIG. 6 is a schematic diagram showing an ICM amplifier circuit 600 for differential signals in accordance with some examples, where ICM amplifier circuits 500 are used in the ICM amplifier circuit 600. In the examples of FIGS. 5 and 6, the resistors R3p-R6p improve the input common mode range of the ICM amplifiers. Unlike the DC amplifier circuit 300 in FIG. 3, each ICM amplifier circuit 500 has only 6 transistors and 4 resistors. The strategy for the ICM amplifier circuit 500 is to have fast circuit (e.g., with low propagation delay whose performance is not critical). Reducing the number of transistors for the ICM amplifier circuit 500 compared to the DC amplifier circuit 300 results in the ICM amplifier circuit 500 being a faster (less parasitic capacitance) and simpler circuit, where the same functionality (compatibility with a high input common mode voltage) is achieved by adding R3p, R3n, R4p, and R4n. These resistors prevent shutting off the current path from VDD to ground. With proper sizing of the R3p, R3n, R4p, and R4n resistors, the cell will be active and will provide amplification of the input signal. Compared to the DC amplifier circuit 300, R3p, R4p, R5p, R6p and/or R3n, R4n, R5n, R6n in FIGS. 5 and 6 will have higher values than the resistors used in the DC amplifier circuit 300 of FIG. 3. Also, the transistors M1p-M4p and/or M1n-M4n for the ICM circuits 500 and 600 of FIGS. 5 and 6 can be smaller than the transistors of the DC amplifier circuit 300. The gain for the ICM amplifier circuits 500 and 600 of FIGS. 5 and 6 depends on the values for R3p, R4p, R5p, R6p and/or R3n, R4n, R5n, R6n and the size of the transistors (M1p-M4p and/or M1n-M4n), where larger transistors and resistors result in a higher gain. In some examples, the area for the ICM amplifier circuit 500 is roughly the same as the DC amplifier circuit 300, while offering faster performance compared to the DC amplifier circuit 300.

With the ICM amplifier circuit 500 or 600, the DC preamplifier circuit 404 is compatible with input voltages that are higher than VDD. In some examples, the input voltage may be scaled using a frequency-compensated voltage divider. The ICM amplifier circuit 600 shows an example of a frequency-compensated voltage divider. More specifically, two resistors (R7p, R8p) and a capacitor (Ccp1) form the frequency-compensated voltage divider for the VIN+ node. Meanwhile, two other resistors (R7n, R8n) and another capacitor (Ccp2) form the frequency-compensated voltage divider for the VIN− node. As shown in FIG. 6, R7p and Ccp1 are coupled in parallel between the VIN+ node and node 602. Also, R8p is coupled between the node 602 and a ground node. In addition, R7n and Ccp2 are coupled in parallel between the VIN− node and node 604. Also, R8n is coupled between the node 604 and a ground node.

In some examples, the value for R7p, R7n, R8p, R8n should be high in order to avoid additional loading of the input signal source (to prevent pulling additional current from the signal source). In one example, R7p=R7n= R8p=R8n=100 k. The parasitic capacitance of the input transistors M1p-M4p and/or M1n-M4n combined with large values for R7p, R7n, R8p, and R8n result in a low pass filter, which can limit the upper frequency range. In order to extend the operating range, Ccp1 and Ccp2 are included, where the value of Ccp1 and Ccp2 may be correlated to value of parasitic capacitance. With the frequency-compensated voltage divider, the impedance formed by parasitic caps M1p-M4p and/or M1n-M4n along with R8p, R8n is equal to the impedance of R7p, R7n in parallel with Ccp1, Ccp2. In such case, the input signal is divided by 2 (R7=R8) without filtering effect (e.g., the amplitude is not declining with 20 dB/dec as in case of a low-pass filter). In one example, if the maximum VDD of the buffer circuit 400 is 1.65V, the input signal (e.g., common move voltage) can be up to 3.3V. This means the input stage for the buffer circuit 400 can support a standard such as LVPECL for VDD values higher than 3.3 V (maximum input voltage in case of LVPECL is VDD-0.8 V). Although the input signal is divided by 2, the gain of the DC preamplifier circuit 404 is about 8 times, which is sufficient to drive the gains stages 406 and 410. The task of the gains stages 406 and 410 is to amplify the signal from rail to rail (VDD to GND).

Figure 7:
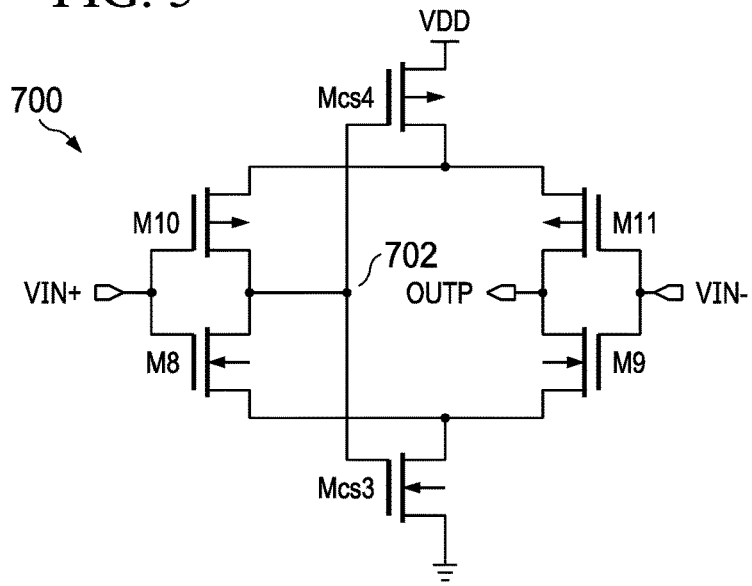
FIG. 7 is a schematic diagram showing a gain amplifier circuit in accordance with some examples.

FIG. 7 is a schematic diagram showing a gain amplifier circuit 700 suitable for the gain stages 406 and 410 in accordance with some examples. As shown, the gain amplifier circuit 700 includes an arrangement of transistors (M8-M11, Mcs3, and Mcs4). More specifically, M8 and M10 have control terminals coupled to a VIN+ node, while M9 and M11 have control terminals coupled to a VIN− node. The first current terminal of M8, the second current terminal of M10, and the control terminals of Mcs3 and Mcs4 are coupled together (e.g., at node 702). Also, the first current terminals M10 and M11 are coupled to the second current terminal of Mcs4. Also, the first current terminal of Mcs4 is coupled to VDD node. Also, the second current terminals of M8 and M9 are coupled to the first current terminal of Mcs3. Also, the second current terminal of Mcs3 is coupled to a ground node. Between the second current terminal of M11 and the first current terminal of M9 is a differential output (OUTP) node. In operation, the gain amplifier circuit 700 is configured to amplify the input signal corresponding to VIN+ and VIN− from rail to rail (VDD to GND).

In some examples, a buffer circuit (e.g., the clock buffer circuit 104 of FIG. 1, or the buffer circuit 400) comprises an input stage (e.g., the input stage 106 of FIG. 1) having an input node (e.g., VIN+ or VIN− in FIG. 4) and a DC amplifier (e.g., the DC amplifier circuit 402) coupled to the input node. The input stage also comprises an AC amplifier (e.g., the AC amplifier circuit 200 of FIG. 2) coupled to an output node (vinp or vinn) of the DC amplifier. The input stage also comprises a capacitor (C1p or C1n) coupled between the input node (e.g., VIN+ or VIN−) and the output node (vinp or vinn) of the DC amplifier. The input stage also comprises a voltage divider coupled to the DC amplifier and the AC amplifier. The voltage divider comprises a first resistor (R2p or R2n) associated with the DC amplifier and a second resistor (R1p or R1n) associated with the AC amplifier, wherein the first resistor is larger than the second resistor.

In some examples, the DC amplifier (e.g., the DC amplifier 402) comprises an ICM amplifier (e.g., the ICM amplifier circuit 500 of FIG. 5, or the ICM amplifier circuit 600 of FIG. 6) coupled to the input node (e.g., VIN+ or VIN−). The DC amplifier also comprises a gain amplifier (e.g., the gain amplifier circuit 700 of FIG. 7) coupled to an output node of the ICM amplifier. The DC amplifier also comprises an inverter (e.g., inverters 408 or 412) coupled to an output node of the gain amplifier. In some examples, the ICM amplifier comprises a frequency-compensation voltage divider (see e.g., R1p, R2p, Ccp1, R1n, R2n, Cccp2 in FIG. 6). In some examples, the frequency-compensation voltage divider comprises a third resistor (e.g., R1p or R1n in FIG. 6), a fourth resistor (e.g., R2p or R2n in FIG. 6), and a capacitor (Ccp1 or Ccp2 in FIG. 6), where a first end of the fourth resistor (e.g., R2p or R2n) and a first plate of the second capacitor (e.g., Ccp1 or Ccp2) are coupled to the input node (e.g., VIN+ or VIN−). Also, a second end of the fourth resistor (e.g., R2p or R2n in FIG. 6) and a second plate of the second capacitor (Ccp1 or Ccp2 in FIG. 6) are coupled to an internal node (e.g., vinp or vinn). A first end of the third resistor (e.g., R1p or R1n in FIG. 6) is coupled to the internal node (e.g., vinp or vinn), and wherein a second end of the third resistor (e.g., R1p or R1n in FIG. 6) is coupled to a ground node.

In some examples, the input stage (e.g., the input stage 106 in FIG. 1) is configured to receive a clock voltage at the input node (e.g., VIN+ or VIN−), where the clock voltage is higher than an input voltage supply (e.g., VDD) for the DC amplifier and the AC amplifier. In some examples, the first resistor (e.g., R2p or R2n) is at least five times as large as the second resistor (R1p or R1n). Also, the DC amplifier and the AC amplifier comprise CMOS components. When the input stage is a differential input stage, the differential input stage includes a complementary input node (e.g., VIN−) and a complementary output node (e.g., vinn) of the DC amplifier. A differential input stage also includes a complementary capacitor (e.g., C1n) between the complementary input node (VIN−) and the complementary output node (vinn) of the DC amplifier. The differential input stage also includes complementary voltage divider resistors coupled to the AC amplifier and the DC amplifier. The complementary voltage divider resistors comprise a first complementary resistor (e.g., R2n) associated with the DC amplifier and a second complementary resistor (e.g., R1n) associated with the AC amplifier, wherein the first complementary resistor is larger than the second complementary resistor.

Figure 8:
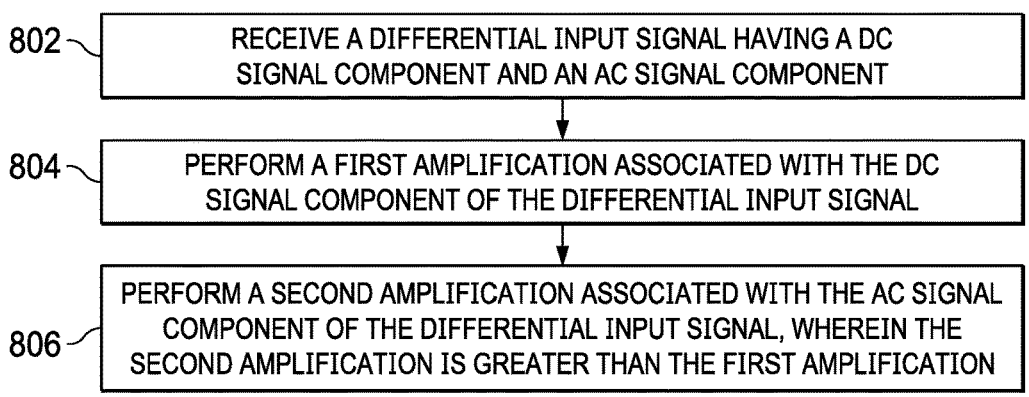
FIG. 8 is a flowchart showing a buffering method in accordance with some examples.

FIG. 8 is a flowchart showing a buffering method 800 in accordance with some examples. In different examples, the buffering method 800 is performed by a buffer circuit (e.g., the buffer circuit 400 of FIG. 4) or a clock buffer circuit (e.g., the clock buffer circuit 104 in FIG. 1), or other input stage circuitry. In one example, the buffering method 800 is used with the output signal of a PLL so that the PLL output can be used to generate multiple signals.

As shown, the buffering method 800 includes receiving a differential input signal having a DC signal component and an AC signal component at block 802. At block 804, a first amplification associated with the DC signal component of the differential input signal is performed. At block 806, a second amplification associated with the AC signal component of the differential input signal is performed, where the second amplification is greater than the first amplification. In some examples, the operations of blocks 804 and 806 involve a voltage divider or frequency-compensated voltage divider as described herein (see e.g., R1p, R1n, R2p, R2n in the buffer circuit 400 of FIG. 4; or R7p, R8p, R7n, R8n in the ICM circuit 600 of FIG. 6). The result of the buffering method 800 is that the voltages at vinp and vinn will not be equal even at very low frequencies. Also, the buffer circuit (e.g., the clock buffer circuit 104 of FIG. 1, or the buffer circuit 400 of FIG. 4) performing the buffering method 800 can receive an input voltage (e.g., a common mode voltage) that is larger than input supply voltage for the buffer circuit.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A clock buffer circuit comprising:
   (a) an AC amplifier circuit including:
      a first differential input and a first differential output;
      a first capacitor having a first plate coupled to the first differential input and having a second plate coupled to a first internal node;
      first and second inverter circuits coupled between the first internal node and the first differential output;
      a second differential input and a second differential output;
      a second capacitor having a first plate coupled to the second differential input and having a second plate coupled to a second internal node; and
      third and fourth inverter circuits coupled between the second internal node and the second differential output; and
   (b) a DC amplifier circuit having a first input coupled to the first differential input, having a first output coupled to the first internal node, having a second input coupled to the second differential input, and a second output coupled to the second internal node; further including;
   a first transistor having a first current terminal coupled to a supply input, having a second current terminal coupled to a middle node, and having a control terminal coupled to the second current terminal;
   a second transistor having a first current terminal coupled to the middle node, having a second current terminal coupled to a ground terminal, and having a control terminal coupled to the first current terminal;
   a first resistor having a first end coupled to the first internal node and a second end coupled to the middle node; and
   a second resistor having a first end coupled to the middle node and a second end coupled to the second internal node.

2. The clock buffer circuit of claim 1 in which the DC amplifier circuit includes a third resistor coupled in series with the first output.

3. The clock buffer circuit of claim 1 in which the DC amplifier circuit includes a fourth resistor coupled in series with the second output.

4. The clock buffer circuit of claim 1 in which the DC amplifier circuit includes a third resistor coupled in series with the first output, and includes a fourth resistor coupled in series with the second output.

5. The clock buffer circuit of claim 1 in which the DC amplifier circuit includes a DC preamplifier having a non-inverting input coupled to the first differential input and having an inverting input coupled to the second differential input.

6. The clock buffer circuit of claim 1 in which the DC amplifier circuit includes a DC preamplifier having a non-inverting input coupled to the first differential input, having an inverting input coupled to the second differential input, having a non-inverting output coupled to the first internal node, and having an inverting output coupled to the second internal node.

7. The clock buffer circuit of claim 6 in which the DC amplifier circuit includes a first gain circuit having a non-inverting input coupled to the DC preamplifier inverting output, having an inverting input coupled to the DC preamplifier non-inverting output, and having a first gain output.

8. The clock buffer circuit of claim 6 in which the DC amplifier circuit includes a second gain circuit having a non-inverting input coupled to the DC preamplifier non-inverting output, having an inverting input coupled to the DC preamplifier inverting output, and having a second gain output.

9. The clock buffer circuit of claim 6 in which the DC amplifier circuit includes:
   a first gain circuit having a non-inverting input coupled to the DC preamplifier inverting output, having an inverting input coupled to the DC preamplifier non-inverting output, and having a first gain output; and
   a second gain circuit having a non-inverting input coupled to the DC preamplifier non-inverting output, having an inverting input coupled to the DC preamplifier inverting output, and having a second gain output.

10. The clock buffer circuit of claim 7 in which the DC amplifier circuit includes a first inverter having an input coupled to the first gain output and having a first inverter output.

11. The clock buffer circuit of claim 8 in which the DC amplifier circuit includes a second inverter having an input coupled to the second gain output and having a second inverter output.

12. The clock buffer circuit of claim 9 in which the DC amplifier circuit includes:
   a first inverter having an input coupled to the first gain output and having a first inverter output; and
   a second inverter having an input coupled to the second gain output and having a second inverter output.

13. The clock buffer circuit of claim 10 in which the DC amplifier circuit includes a third resistor having a first end coupled to the first inverter output and a second end coupled to the first internal node.

14. The clock buffer circuit of claim 11 in which the DC amplifier circuit includes a fourth resistor having a first end coupled to the second inverter output and a second end coupled to the second internal node.

15. The clock buffer circuit of claim 12 in which the DC amplifier circuit includes:
   a third resistor having a first end coupled to the first inverter output and a second end coupled to the first internal node; and
   a fourth resistor having a first end coupled to the second inverter output and a second end coupled to the second internal node.

* * * * *